United States Patent [19]

Shigeta et al.

[11] Patent Number: 4,973,951
[45] Date of Patent: Nov. 27, 1990

[54] DOUBLE-SIDED DISPLAY APPARATUS

[75] Inventors: Takeshi Shigeta; Tokuichiro Ito, both of Kanagawa, Japan

[73] Assignee: Stanley Electric Co., Ltd., Tokyo, Japan

[21] Appl. No.: 347,748

[22] Filed: May 5, 1989

[30] Foreign Application Priority Data

Mar. 9, 1989 [JP] Japan .............................. 1-27152[U]

[51] Int. Cl.$^5$ .............................................. H05K 1/14
[52] U.S. Cl. ..................................... 340/717; 340/718; 340/700; 40/572; 361/399
[58] Field of Search ............... 340/717, 718, 719, 700, 340/752, 762, 782, 716, 762, 782; 361/399, 395; 40/572, 564, 573

[56] References Cited

U.S. PATENT DOCUMENTS

| | | | |
|---|---|---|---|
| 4,243,986 | 1/1981 | Nixon | 340/756 |
| 4,367,467 | 1/1983 | Emile | 340/718 |
| 4,684,974 | 8/1987 | Mutsunaga | 340/718 |
| 4,791,531 | 12/1988 | Jessup | 361/399 |

Primary Examiner—Alvin E. Oberley
Attorney, Agent, or Firm—Nixon & Vanderhye

[57] ABSTRACT

In a double-sided display device, a case includes a case body formed integrally. The case body has a pair of opposed, but spaced first and second walls and an intermediate wall connecting the first and second walls to each other. The first and second walls are provided with a first pair of opposed parallel channels which are located adjacent a front opening, and a second pair of opposed parallel channels which are located adjacent a rear opening. A third pair of opposed parallel channels are provided such that a plane including a third pair of channels is located between the first and second pairs of channels. Each of a pair of display units has a display assembly of dot-matrix type mounted on a circuit board. The circuit boards of the respective display units are inserted respectively into the first and second pairs of channels. A drive unit has a drive controller mounted on a circuit board, for driving the display assemblies to cause them to effect their respective displays. The circuit board of the drive unit is inserted into the third pair of channels.

9 Claims, 3 Drawing Sheets

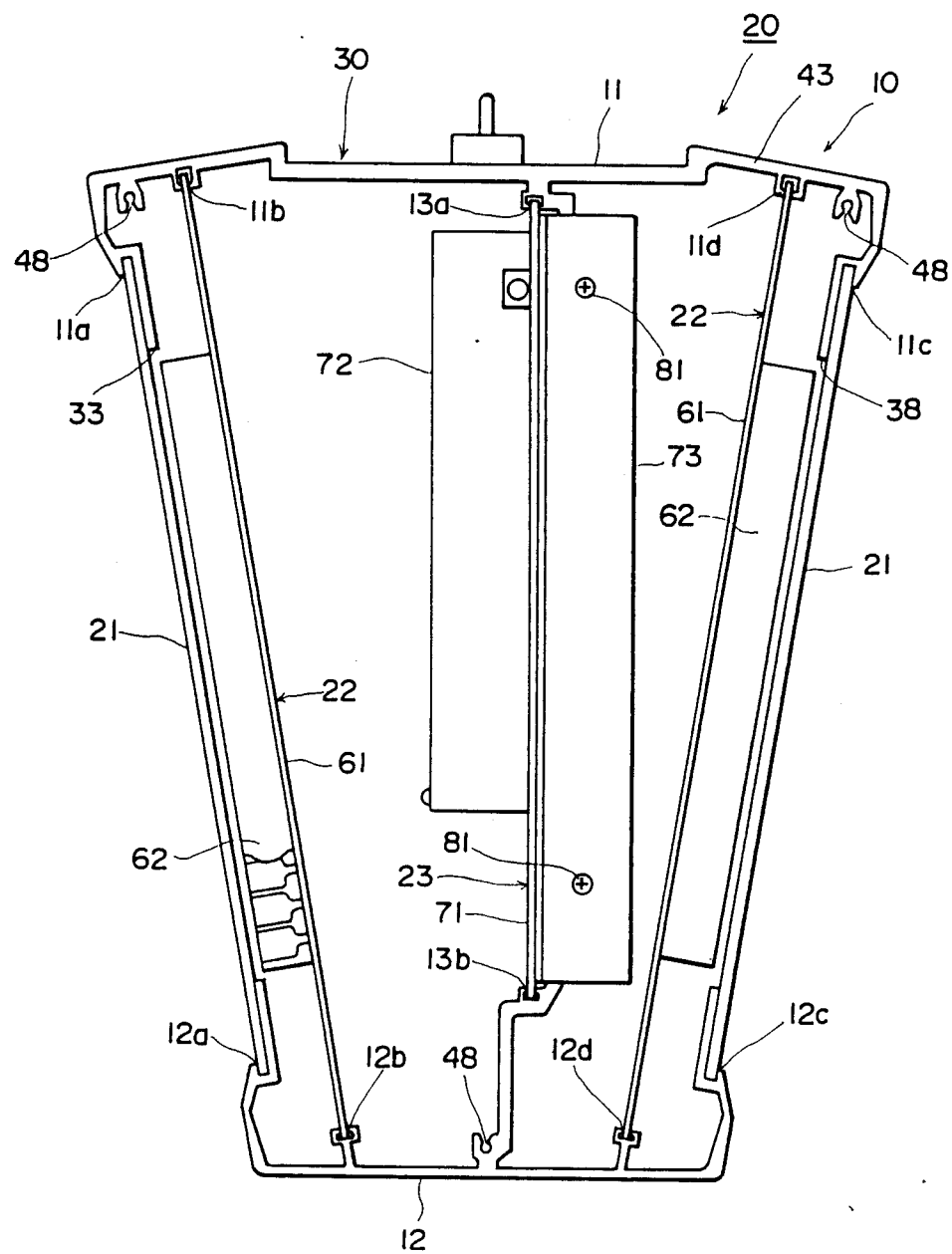

DOUBLE-SIDED DISPLAY APPARATUS

BACKGROUND OF THE INVENTION

The present invention relates to a double-sided display apparatus in which a pair of display units of dot-matrix type having, for example, LEDs (light emitting diodes), LCD (liquid crystal display) elements or the like are mounted respectively at both front and rear openings of a case.

A double-sided display apparatus is known in which a pair of display panels are mounted respectively at front and rear openings of a case. In such display apparatus, a large number of fastening elements are required to be employed in order to fixedly mount the display panels in their respective positions on the case. Further, after the display panels have been fixedly mounted in their respective positions on the case, it is required to effect complicated wiring operation in order to electrically connect power-source lines and signal lines to the display units. The mounting operation and the wiring operation are troublesome and cumbersome. It takes a considerable time for the mounting operation and the wiring operation. Thus, the assembling cost increases, resulting in an increase in the manufacturing cost of the double-sided display apparatus.

SUMMARY OF THE INVENTION

It is therefore an object of the invention to provide a double-sided display apparatus having a relatively simple construction and easy assembly and, therefore, is advantageous in terms of productivity, transportation and installation.

For the purpose stated above there is provided, according to the present invention, a double-sided display apparatus comprising:

a case including a case body formed integrally, the case body having a pair of opposed, but spaced first and second walls and an intermediate wall connecting the first and second walls to each other, the first and second walls having their respective one side edges which cooperate with each other to define a front opening, the other side edges of the respective first and second walls cooperating with each other to define a rear opening, the first and second walls being provided with a first pair of opposed parallel channels which are located adjacent the front opening and which extend parallel to the front opening, and a second pair of opposed parallel channels which are located adjacent the rear opening and which extend parallel to the rear opening, said case body being further provided with a third pair of opposed parallel channels, wherein a plane including said third pair of channels is located between the first and second pairs of channels;

a pair of display units each having a circuit board and display means of dot-matrix type mounted on the circuit board, the circuit boards of the respective display units being inserted respectively into the first and second pairs of channels such that the display means of the respective display units are positioned respectively at the front and rear openings; and a drive unit having a circuit board and drive circuit means mounted on the circuit board of the drive unit for driving the display means of the respective display units to cause the display means to effect their respective displays, the circuit board of the drive unit being inserted into the third pair of channels.

With the arrangement of the double-sided display device according to the invention, when the display units and the drive unit are mounted to the case, side edges of the circuit boards of the respective display units are inserted into the first and second pairs of channels, and side edges of the circuit board of the drive unit are inserted into the third pair of channels, such that the display units and the drive unit are arranged in their respective positions on the case. Specifically, by the insertion into the channels, the display units are positioned and retained respectively at the front and rear openings of the case, while the drive unit is positioned and retained between the display units. In this manner, the display units and the drive unit can be mounted to the case by insertion into their respective channels, easily and for a short period of time. Thus, assembling of the double-sided display apparatus can be made easy, making it possible to reduce the assembling cost. Further, since the case is formed integrally, it is possible to reduce the manufacturing cost of the display apparatus. Furthermore, if any one of the display units and the drive unit malfunctions, only the malfunctioned unit is removed from the case and is replaced with a new unit, whereby repair and replacement of the units can be made easy, making it possible to reduce the maintenance cost. Thus, according to the invention, there is provided the double-sided display apparatus which is simple in construction and easy in assembling and, therefore, which is advantageous in productivity, transportation and installation.

BRIEF DESCRIPTION OF THE DRAWINGS

FIG. 3 is a side elevational view of the display apparatus in an assembled state, with one of a pair of end covers removed.

DETAILED DESCRIPTION

Figure 1:
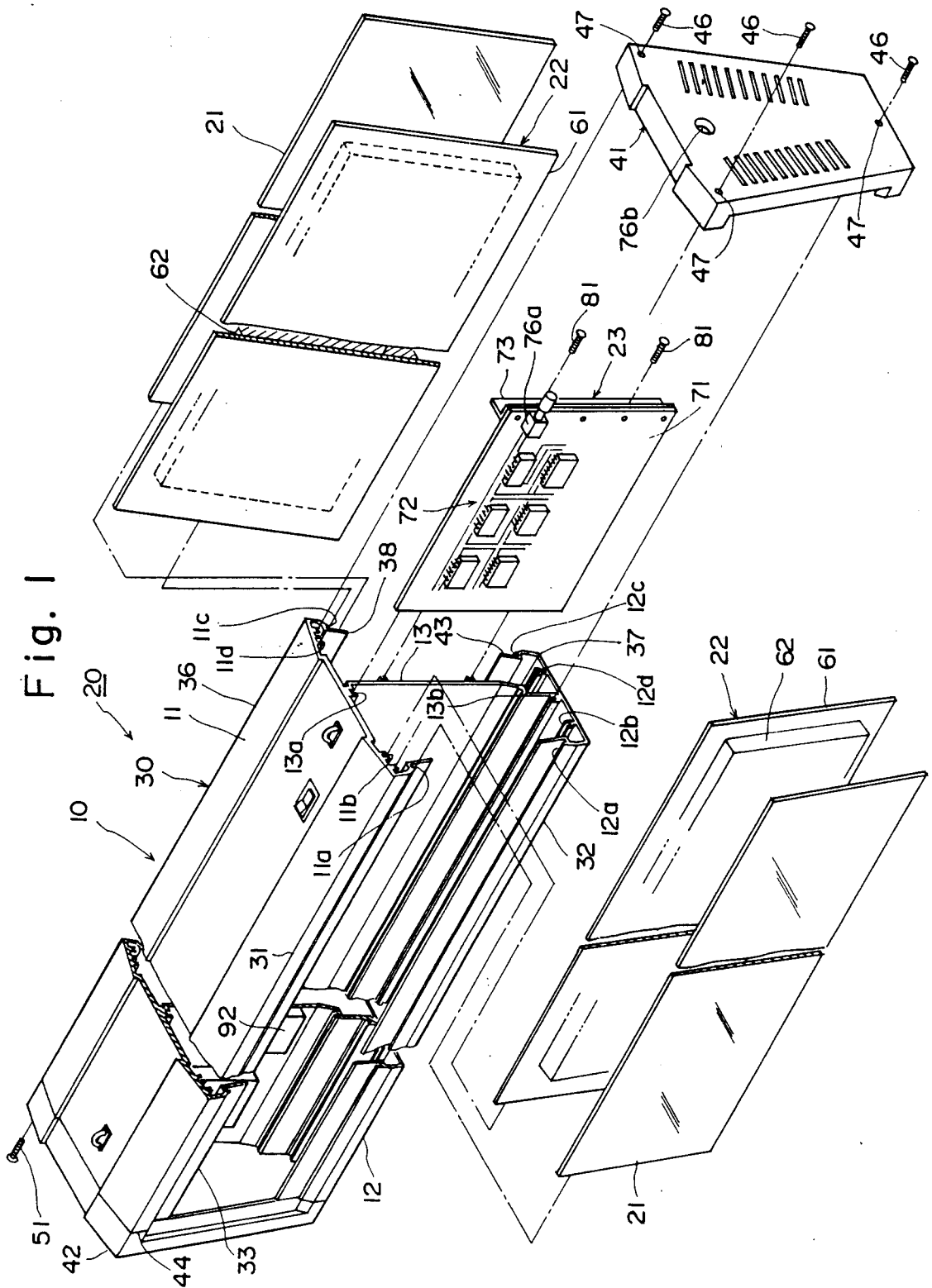
FIG. 1 is an exploded perspective view of a double-sided display apparatus according to an embodiment of the invention.
Figure 2:
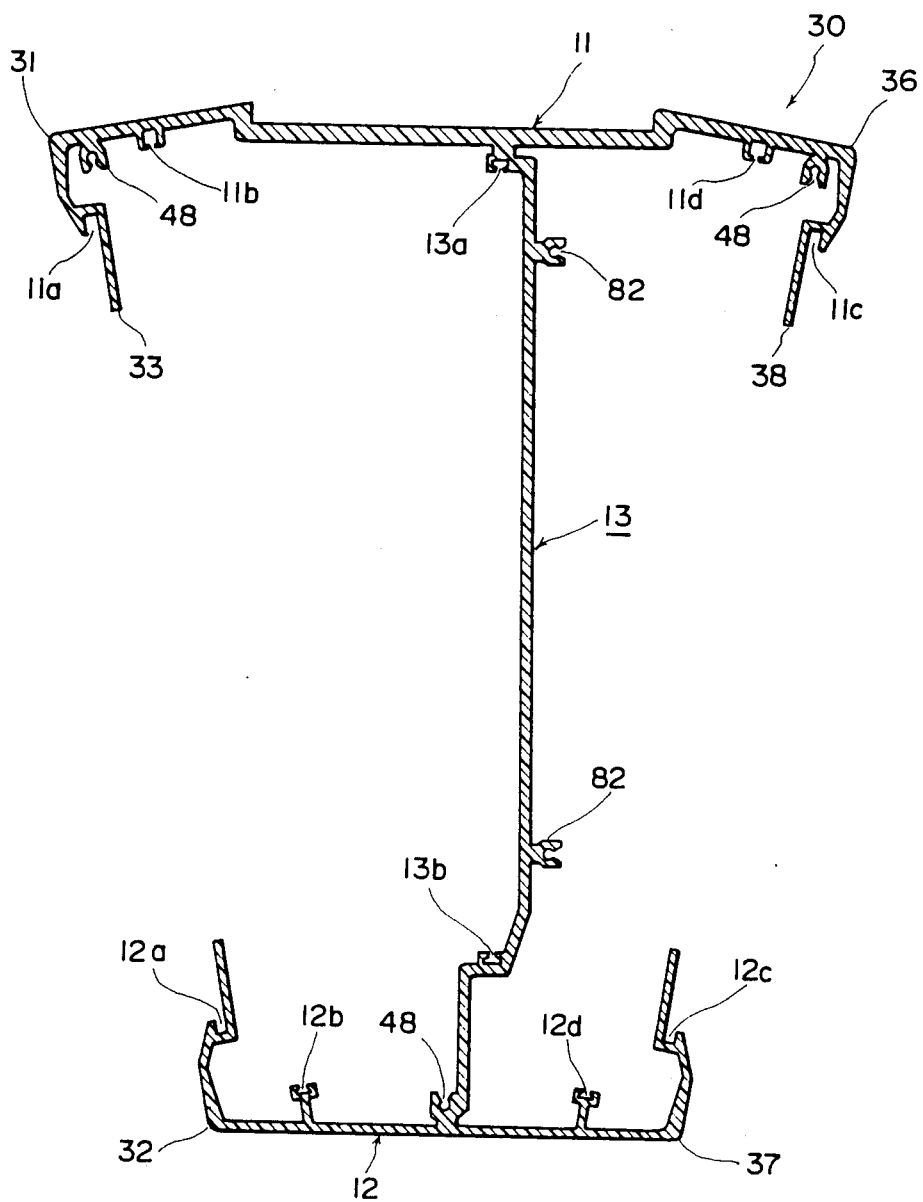
FIG. 2 is a cross-sectional view of a case illustrated in FIG. 1.

Referring to FIGS. 1 through 3, there is illustrated a double-sided display apparatus 20 according to the invention. The display apparatus 20 comprises a case 10 which, as clearly shown in FIGS. 1 and 2, includes an elongated case body 30 formed integrally. The case body 30 has substantially I-shaped cross-section, and has a pair of opposed, but spaced first and second walls 11 and 12 and an intermediate wall 13 connecting the first and second walls 11 and 12 to each other. The intermediate wall 13 extends longitudinally of the case body 30 and connects substantially widthwise centers of the respective first and second walls 11 and 12 to each other. The first and second walls 11 and 12 have their respective one side edges 31 and 32 which cooperate with each other to define a front opening 33. The other side edges 36 and 37 of the respective first and second walls 11 and 12 cooperate with each other to define a rear opening 38.

The first wall 11 of the case body 30 has an inner surface which is provided with two channels 11b and 11d extending parallel to each other and parallel to the intermediate wall 13. A channel 13a is provided which is located at a connection between the first wall 11 and the intermediate wall 13 and which extends along the intermediate wall 13 in parallel relation to the first wall 11. Likewise, the second wall 12 has an inner surface which is provided with two channels 12b and 12d extending parallel to each other and parallel to the intermediate wall 13. The intermediate wall 13 has a section adjacent the second wall 12, which is formed with a channel 13b extending along the intermediate wall 13 in parallel relation to the second wall 12. The channels 11b and 12b cooperate with each other to form a first pair of opposed parallel channels which are located adjacent the front opening 33 and which extend parallel to the front opening 33. A plane including the first pair of channels 11b and 12b is inclined with respect to the intermediate wall 13. Likewise, the channels 11d and 12d cooperate with each other to form a second pair of opposed parallel channels which are located adjacent the rear opening 38 and which extend parallel to the rear opening 38. A plane including the second pair of channels 11d and 12d is inclined with respect to the intermediate wall 13 in mirrored-image relation to the plane including the first pair of channels 11b and 12b. Further, the channels 13a and 13b cooperate with each other to form a third pair of opposed parallel channels which extend parallel to the intermediate wall 13. A plane including the third pair of channels 13a and 13d is located between the first and second pairs of channels 11a and 12a and 11d and 12d.

The first wall 11 of the case body 30 is further provided with two channels 11a and 11c, while the second wall 12 is further provided with two channels 12a and 12c. The channels 11a and 12a cooperate with each other to form a fourth pair of opposed parallel channels extending respectively along the one side edges 31 and 32 of the first and second walls 11 and 12. A plane including the fourth pair of channels 11a and 12a is inclined with respect to the intermediate wall 13 at the same angle as that at which the plane including the first pair of channels 11b and 12b is inclined. Likewise, the channels 11c and 12c cooperate with each other to form a fifth pair of opposed parallel channels extending respectively along the other side edges 36 and 37 of the first and second walls 11 and 12. A plane including the fifth pair of channels 11c and 12c is inclined with respect to the intermediate wall 13 at the same angle at which the plane including the second pair of channels 11d and 12d is inclined. As shown in FIGS. 1 and 3, the case 10 further includes a pair of transparent protective covers 21 and 21 which are mounted respectively to the front and rear openings 33 and 38. The transparent protective covers 21 and 21 are made of, for example, acrylic resin or polyacrylate. That is, the pair of transparent protective covers 21 and 21 are inserted respectively into the fourth and fifth pairs of channels 11a and 12a and 11c and 12c.

Referring to FIG. 1, the case 10 further includes a pair of end covers 41 and 42 which can be mounted respectively to one and other longitudinal ends 43 and 44 of the case body 30. That is, the end cover 41 can be mounted to the longitudinal one end 43 of the case body 30 by means of screws 46. The screws 46 pass respectively through bores 47 in the end cover 41 and can be threadedly engaged with threaded openings 48 (see FIGS. 2 and 3) formed in elongated projections on the inner surfaces of the first and second walls 11 and 12. Likewise, the end cover 42 can be mounted to the longitudinal other end 44 of the case body 30 by means of screws 51 (only one shown). The screws 51 pass respectively through bores in the end cover 42 and can be threadedly engaged with the threaded openings 48 formed in the elongated projections on the inner surfaces of the first and second walls 11 and 12.

As shown in FIGS. 1 and 3, a pair of display units 22 and 22 are accommodated in the case 10. Each of the pair of display units 22 has a circuit board 61 and a display assembly 62 mounted on the circuit board 61. The display assembly 62 is composed of, for example, a plurality of light emitting diodes (LEDs) which are arranged on the circuit board 61 in a dot-matrix fashion. The circuit boards 61 and 61 of the respective display units 22 and 22 are inserted respectively into the first and second pairs of channels 11b and 12b and 11d and 12d such that the display assemblies 62 and 62 of the respective display units 22 and 22 are positioned respectively at the front and rear openings 33 and 38.

A drive unit 23 is accommodated in the case 10. The drive unit 23 has a circuit board 71 having its length shorter than the circuit board 61 of each of the display units 22. The drive unit 23 further has a drive control circuit assembly 72 mounted on the circuit board 71 for driving the display assemblies 62 and 62 of the respective display units 22 and 22, to cause selected some of the LEDs of the each display assembly 62 to effect display in a suitable pattern. The drive control circuit assembly 72 can electrically be connected to an electric power source or a switching power supply 92 which is mounted on the intermediate wall 13. The circuit board 71 of the drive unit 23 is inserted into the third pair of channels 13a and 13b. The circuit board 71 is provided with a bracket member 73 having an L-shaped cross-section. The bracket member 73 extends along one end of the body of the circuit board 71. A reset button 76a for the drive control circuit assembly 72 is mounted to the one end of the body of the circuit board 71. In this connection, the end cover 41 is provided with a switch window 76b for the reset button 76a.

The double-sided display apparatus 20 constructed as above is assembled in the following manner.

That is, first, the cover 42 is mounted to the other end 44 of the case body 30, as shown in FIG. 1. Subsequently, the display units 22 and 22 are prepared which have beforehand been subject to requisite wiring. The side edges of the circuit board 61 of one of the pair of display units 22, on which the display assembly 62 is mounted, are brought respectively into register with ends of the first pair of channels 11b and 12b, and are inserted respectively into the first pair of channels 11b and 12b until the circuit board 61 is abutted against the end cover 42. Thus, the one display unit 22 is arranged in position within the case 10. Likewise, the side edges of the circuit board 61 of the other display unit 22 are inserted respectively into the second pair of channels 11d and 12d until the circuit board 61 is abutted against the end cover 42. In this manner, the pair of display units 22 and 22 are located and retained in their respective positions within the case 10 such that the display assemblies 62 and 62 are arranged respectively at the front and rear openings 33 and 34.

Subsequently, the drive unit 23 is prepared which has beforehand been subject to requisite wiring. The side edges of the circuit board 71 of the drive unit 23, on which the drive control circuit assembly 72 is mounted, are brought respectively into register with ends of the third pair of channels 13a and 13b, and are inserted respectively into the third pair of channels 13a and 13b until the bracket member 73 is abutted against a longitudinal end of the intermediate wall 13. Then, screws 81 are passed respectively through bores in the bracket member 73 of the drive unit 23 and are threadedly engaged respectively with threaded openings 82 (see FIG. 2) in projections on the intermediate wall 13. Thus, the drive unit 23 is mounted to the case body 30 and are located in position within the case 10.

Subsequently, the pair of transparent protective covers 21 and 21 are inserted respectively into the fourth and fifth pairs of channels 11a and 12a and 11c and 12c to close the front and rear openings 33 and 38, respectively.

Finally, the end cover 41 is mounted to the one end 43 of the case body 30 by means of the screws 46. By the end cover 41, the display units 22 and 22 and the transparent protective covers 21 and 21 are fixed and retained so as not to get out of the case body 30. Thus, assembling of the double-sided display apparatus 20 is completed.

When electric power is supplied to the drive unit 23 from the switching power supply 92, the drive control circuit assembly 72 drives the display assemblies 62 and 62 of the respective display units 22 and 22 so that selected some of the LEDs of each display assembly 62 emit their respective lights in a desired pattern. Thus, the display units 22 and 22 of the double-sided display apparatus 20 effect their respective desirable dot-matrix light emitting displays.

The embodiment has been described as having the display units 22 and 22 each of which comprises the display assembly 62 composed of a plurality of LEDs. It is needless to say that the display assembly may be composed of any other suitable display elements such as, for example, liquid crystal display elements or the like. Further, the pair of end covers 41 and 42 are not essential to the invention, but can be dispensed with. That is, the case 10 may have its opposite ends which open. In this case, the pair of display units 22 and 22 and the pair of transparent protective covers 21 and 21 are fixed in their respective positions by means of screws, pins or the like. Furthermore, one of the end covers 41 and 42 may be formed integrally on one of the opposite ends 43 and 44 of the case body 30. In addition, it is of course that the electric power source or the switching power supply 92 may be mounted on the outside of the display apparatus.

What is claimed is:

1. A double-sided display apparatus comprising:
   (a) a case including an integrally formed case body having a generally I-shaped cross-sectional configuration,
      said case body having a pair of opposed, but spaced, first and second walls and an intermediate wall connecting said first and second walls to each other, said first and second walls having their respective one side edges cooperate with each other to define a front opening, the other side edges of the respective first and second walls cooperating with each other to define a rear opening,
      said first and second walls being provided with a first pair of opposed parallel channels which are located adjacent said front opening and which extend parallel to said front opening, and a second pair of opposed parallel channels which are located adjacent said rear opening and which extend parallel to said rear opening,
      said case body being further provided with a third pair of opposed parallel channels, wherein a plane including said third pair of channels is located between said first and second pairs of channels, and wherein said third pair of channels extend along said intermediate wall;
   (b) a pair of display units each having a circuit board and display means of dot-matrix type mounted on said circuit board, the circuit boards of the respective display units being inserted respectively into said first and second pairs of channels such that the display means of the respective display units are positioned respectively at said front and rear openings; and
   (c) a drive unit having a circuit board and drive circuit means mounted on said circuit board of said drive unit for driving said display means of respective display units to cause said display means to effect their respective displays, said circuit board of said drive unit being inserted into said third pair of channels.

2. A double-sided display device according to claim 1, wherein one of said third pair of channels is located at a connection between one of said first and second walls and said intermediate wall, while the other of said third pair of channels is provided on said intermediate wall at a location adjacent the other of said first and second wall.

3. A double-sided display device according to claim 1, wherein said case further includes a pair of transparent protective covers mounted respectively to said front and rear openings.

4. A double-sided display device according to claim 3, wherein said first and second walls are further provided with a fourth pair of opposed parallel channels extending respectively along the one side edges of the first and second walls and a fifth pair of opposed parallel channels extending respectively along the other side edges of the first and second walls, said pair of transparent protective covers being inserted respectively into said fourth and fifth pairs of channels.

5. A double-sided display device according to claim 1, wherein said case further includes a pair of end covers mounted respectively to one and other ends of the case body.

6. A double-sided display device according to claim 1, wherein said display means of each of said display units comprises a plurality of light emitting diodes.

7. A double-sided display apparatus comprising a display case of preselected longitudinal dimension, said display case including:
   an elongate case body having first, second and intermediate walls integrally joined one to another, wherein said first and second walls are opposingly separated from one another by means of said intermediate wall, said intermediate wall extending longitudinally of said case body and being integrally joined to substantially the widthwise centers of said first and second walls so that said case body, in longitudinal cross-section, is generally I-shaped;
   said first and second walls defining front and rear pairs of opposing and longitudinally extending side edges which establish front and rear longitudinally extending openings, respectively;
   said first and second side walls of said case body also including first and second pairs of opposing longitudinally extending circuit board-mounting channels positioned interiorly adjacent to said front and rear openings, and which establish longitudinally extending front and rear circuit board-mounting planes, respectively;

said intermediate wall of said case body including a pair of opposing parallel intermediate channels extending longitudinally of said case body adjacent said intermediate wall to thereby establish a longitudinally extending intermediate circuit board-mounting plane; wherein said display apparatus further includes;

front and rear display means each having a circuit board whose edges are inserted into and retained by said front and rear pairs of circuit board-mounting channels, respectively, of said case body so that said circuit boards of said front and rear display means are respectively positioned within said established front and rear circuit board-mounting planes, whereby said front and rear display means are positioned adjacent said front and rear openings, respectively; and circuit driver means for driving said front and rear display means, said circuit driver means having a circuit board whose edges are inserted into and retained by said opposing intermediate circuit board-mounting channels of said case body so that said circuit board of said circuit driver means is positioned within said intermediate circuit board-mounting plane and thereby disposed between said front and rear circuit board-mounting planes.

8. A double-sided display case as in claim 7, wherein said front and rear pairs of opposing side edges of said first and second walls, respectively, further include front and rear pairs of opposing parallel cover-mounting channels defining front and rear cover-mounting planes that are parallel to said front and rear circuit board-mounting planes for said front and rear display means, respectively, said front and rear pairs of opposing parallel cover-mounting channels being disposed on an exterior side of said front and rear circuit board-mounting channels, respectively.

9. A double-sided display case as in claim 8, wherein said front circuit board-mounting plane and said front cover-mounting plane are each parallel to one another but angularly oriented with respect to said intermediate circuit board-mounting plane, and wherein said rear circuit board-mounting plane and said rear cover-mounting plane are each parallel to one another but angularly oriented with respect to said intermediate circuit board mounting plane in mirror image relationship to said angular orientation of said front circuit board-mounting and cover-mounting planes.

* * * * *